(12) United States Patent
Bosshart

(10) Patent No.: US 9,087,585 B2
(45) Date of Patent: Jul. 21, 2015

(54) TCAM WITH EFFICIENT RANGE SEARCH CAPABILITY

(71) Applicant: Texas Instruments Incorporated, Dallas, TX (US)

(72) Inventor: Patrick W. Bosshart, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/205,780

(22) Filed: Mar. 12, 2014

(65) Prior Publication Data

US 2014/0268971 A1     Sep. 18, 2014

Related U.S. Application Data

(60) Provisional application No. 61/777,143, filed on Mar. 12, 2013, provisional application No. 61/921,886, filed on Dec. 30, 2013.

(51) Int. Cl.
  *G11C 15/00*     (2006.01)
  *G11C 15/04*     (2006.01)

(52) U.S. Cl.
  CPC ........................... *G11C 15/04* (2013.01)

(58) Field of Classification Search
  USPC .................................. 365/49.1, 49.17, 49.18
  See application file for complete search history.

(56) References Cited

U.S. PATENT DOCUMENTS

| | | | | |
|---|---|---|---|---|
| 7,539,032 B2* | 5/2009 | Ichiriu et al. | ............... | 365/49.17 |
| 7,783,654 B1* | 8/2010 | Sreenath | ..................... | 365/49.1 |
| 7,787,275 B1* | 8/2010 | Birman et al. | ............... | 365/49.1 |
| 7,881,125 B2* | 2/2011 | Srinivasan et al. | ........... | 365/49.1 |
| 7,889,530 B2* | 2/2011 | Yu et al. | ....................... | 365/49.1 |
| 8,176,242 B1* | 5/2012 | Shamis et al. | ............... | 365/49.1 |
| 8,233,302 B2* | 7/2012 | Arsovski et al. | ........... | 365/49.17 |
| 8,943,268 B2* | 1/2015 | Sun | .............................. | 365/49.1 |

* cited by examiner

*Primary Examiner* — Trong Phan
(74) *Attorney, Agent, or Firm* — John R. Pessetto; Charles A. Brill; Frank D. Cimino

(57) ABSTRACT

An embodiment of the invention includes a ternary content addressable memory (TCAM) that has input search data bits, TCAM words and range search input data bits. Each TCAM word is operable to store a match pattern and provide a match output. The match output indicates a match when the match pattern of the TCAM word matches the TCAM input search data bits. The range search input data bits are separated into groups. Each group has a bit width N where N is the number of range search input data bits. For the match pattern in each group, there is a Boolean function that uses the N range of search input data bits. $(2^N)/2$ TCAM bits are provided for each TCAM word. $2^N$ internal TCAM search lines are operable to search the $(2^N)/2$ TCAM bits. Decoder logic is associated with each group that decodes the N range search input data bits.

6 Claims, 7 Drawing Sheets

TCAM WITH EFFICIENT RANGE SEARCH CAPABILITY

CROSS-REFERENCED TO RELATED APPLICATIONS

This application claims priority from Provisional Application No. 61/777,143, filed Mar. 12, 2013;

And also claims priority from Provisional Application No. 61/921,886, filed Dec. 30, 2013.

BACKGROUND

Network switches inspect fields in the headers of Ethernet packets in order to determine what action to perform on the packet. Actions may include sending the packet to a specific output port and a specific queue for that port, multicasting or broadcasting the packet to several ports, sending the packet to a network controller so it can determine the packet should be sent, or dropping the packet by not sending it to any destination. Packets have headers representing several levels of the 7 layer OSI model defining packet transport. Typically, these headers follow one another in increasing layer number of the OSI model. As an example, a packet may begin with a Medium Access Control (MAC) header at level 2, followed by an Internet Protocol (IP) header at level 3, followed by a Transmission Control Protocol (TCP) header at level 4. Each of these headers internally has a number of individual fields which may be inspected by the switch. At the level 2 MAC layer, the MAC header contains MAC source and destination addresses, along with an ethertype. An IP header at layer 3 contains IP source and destinations and an IP protocol, among other fields. A TCP header at level 4 contains TCP source and destination port numbers, among other fields. All these fields may be inspected by the switch, and may be modified in the course of determining the disposition of the packet.

Switches usually function by associatively matching packet fields against internal switch tables. For example, a Level 2 switch may contain a table of MAC destination addresses. Each incoming packet has its MAC destination address extracted, and then the MAC destination table is searched to determine whether it contains the packet's MAC destination address. If it does, an action is retrieved from data associated with the matching table entry, which specifies the output destination port for the packet. This match/action paradigm is formalized by the OpenFlow standard, but both OpenFlow and conventional (non OpenFlow) switches perform the same functions of matching packet header fields against internal tables, and performing actions specified by data associated with the matching entry.

One common feature of a switch is an Access Control List (ACL). An ACL table implements the important function of providing a single bit output, specifying what is commonly referred to as permit vs. deny, that is, specifying whether the packet is allowed to proceed (permit) or whether the packet is dropped immediately (deny). ACL tables represent a switch's and the entire Internet's first line of defense against a wide variety of attacks.

A typical ACL table does not just match against a single packet header field; several packet header fields are grouped together and presented to the ACL table, whose entries have values for the aggregate data word representing the concatenation of all desired fields. A common configuration for an ACL table is to match against the so-called TCP 5-tuple: IP source and destination addresses (32b each for IPV4), IP protocol (8 bits), and TCP source and destination port numbers (16b each), a total of 104 bits.

ACL tables, along with some of the other tables in switches, allow ternary matches, where for a table entry, each bit may be 1, 0 or don't care (also called a wildcard bit). If the table entry bit is a 1 or 0, the incoming packet must contain that 1 or 0 in order for the table entry to match, whereas if the table entry is a don't care, the corresponding packet header bit may be either 1 or 0, with the bit effectively not participating in the match requirement.

When tables do not contain any wildcard bits, they are referred to as exact match tables. These have efficient hardware implementations where the dominant cost of a table entry is storing its match value in a memory such as SRAM. These may be organized and accessed as hashtables. Cuckoo hashtables are specific types of hashtables which prevent a hashtable collision problem by using a hash fill algorithm providing high occupancy. Most of the entries provided by the hashtable SRAM will be able to be filled with match entries. For example, a 4 way Cuckoo hashtable can be filled to at least 95% occupancy.

When tables contain wildcard bits, they are more expensive to implement, and at the performance levels of typical hardware switches are usually implemented using TCAMs (Ternary Content Addressable Memories). In addition to storing a ternary value at each table bit location, TCAMs include matching logic to determine whether each TCAM entry matches against a search word provided as an input to the TCAM. TCAMs are more expensive to implement than SRAMs, where expense is measured as the amount of Silicon area required to implement a bit of a single match entry. This is because a TCAM actually must contain two SRAM bit cells to store the two bits required to represent the three values of a ternary entry. Furthermore, there is logic attached to each bit-cell to determine whether it matches (in a ternary sense) its bit of the search word, and to combine all individual bit matches into a single output representing whether that TCAM entry matched or not.

A TCAM table may be 6-7× more expensive in area than an equivalent exact match table. It also dissipates substantially more power. As a result, the amount of TCAM table provided on switches is typically much smaller than the amount of SRAM-based exact match table. TCAM tables on switches are considered a scarce and precious resource.

Some type of tables allowing wildcard bits, called longest prefix match (LPM) tables, have table entries with prefix coding, requiring all 1 or 0 entries on most significant bits (msbs), with least significant bits least significant bits (lsbs) being wildcarded. Table entries consist of a string of 1/0's starting from the msb optionally followed by a number of don't cares. No 1/0 constants can appear in less significant bit positions than wildcard entries. This special type of table is useful for IP address matching, and sometimes is built with special purpose hardware, other than TCAM. However, this technique is generally not applicable to ACL tables. Special purpose LPM tables generally match against a single prefix coded field (like a 32 bit IP address), whereas an ACL table contains a number of fields.

ACL tables are usually ternary tables and therefore use expensive TCAM rather than cheap SRAM. The number of provided ACL entries is therefore quite limited since they cannot use the LPM table architecture.

An ACL entry often doesn't just specify ternary values for entries, it specifies a range for some of its constituent fields. A common scenario is that the TCP source and destination port numbers may be ranges. For example, a range for a (16 bit) TCP port may be from 1024 to 65535. A logic decomposition of this range into ternary entries is as follows, where (-) indicates a don't care:

```
range from 0x0400 to 0xffff
bit
1111      11
5432      1098      7654      3210
1--- ---- ---- ----           ;0x8000 to 0xffff
01-- ---- ---- ----           ;0x4000 to 0x7fff
001- ---- ---- ----           ;0x2000 to 0x3fff
0001 ---- ---- ----           ;0x1000 to 0x1fff
0000 1--- ---- ----           ;0x0800 to 0x8fff
0000 01-- ---- ----           ;0x0400 to 0x04ff
```

Above, the contribution of each line in covering the range from 0x0400 to 0xffff (a 0x header means a hex, base 16 number) is indicated to its right. The arrangement where all the don't-cares are in the lsbs is commonly called prefix coding. All lines but the first can be changed so the leading 0's become don't-cares; the added portion of the Boolean space in each entry is actually covered by earlier entries. While individual TCAM implementations may prefer that these bits set one way or the other to minimize power, here they will generally be made don't cares for clarity of reading:

```
1--- ---- ---- ----           ;0x8000 to 0xffff
-1-- ---- ---- ----           ;0x4000 to 0x7fff
--1- ---- ---- ----           ;0x2000 to 0x3fff
---1 ---- ---- ----           ;0x1000 to 0x1fff
---- 1--- ---- ----           ;0x0800 to 0x8fff
---- -1-- ---- ----           ;0x0400 to 0x04ff
```

The number of ternary words required to represent a range varies according to the range. For example, the range 1 to 65535 requires 16 entries:

```
1--- ---- ---- ----
-1-- ---- ---- ----
--1- ---- ---- ----
---1 ---- ---- ----
---- 1--- ---- ----
---- -1-- ---- ----
---- --1- ---- ----
---- ---1 ---- ----
---- ---- 1--- ----
---- ---- -1-- ----
---- ---- --1- ----
---- ---- ---1 ----
---- ---- ---- 1---
---- ---- ---- -1--
---- ---- ---- --1-
---- ---- ---- ---1
```

The range 1 to 65534, permitting all but the lowest (0) and highest (65535) values, requires 30 entries. This is the worst case:

```
1--- ---- ---- ---0
1--- ---- ---- --0-
1--- ---- ---- -0--
1--- ---- ---- 0---
1--- ---- ---0 ----
1--- ---- --0- ----
1--- ---- -0-- ----
1--- ---- 0--- ----
1--- ---0 ---- ----
1--- --0- ---- ----
1--- -0-- ---- ----
1--- 0--- ---- ----
1--- 0--- ---- ----
1--0 ---- ---- ----
1-0- ---- ---- ----
10-- ---- ---- ----
01-- ---- ---- ----
0-1- ---- ---- ----
0--1 ---- ---- ----
0--- 1--- ---- ----
0--- -1-- ---- ----
0--- --1- ---- ----
0--- ---1 ---- ----
0--- ---- 1--- ----
0--- ---- -1-- ----
0--- ---- --1- ----
0--- ---- ---1 ----
0--- ---- ---- 1---
0--- ---- ---- -1--
0--- ---- ---- --1-
0--- ---- ---- ---1
```

Equivalent functionality is achieved if all don't-cares between the first and second digits in each entry are replaced with the value of the first digit, for example 0--1--... becomes 0001-..., making the entries conform to prefix coding, where all entries their wildcard bits at the end, after all 1,0 bits.

Each of the above entries represents a portion of the specified range, which (for convention) we will specify as outputting a permit rather than deny. However, TCAM entries are prioritized, so it is possible to intersperse permit and deny entries, simplifying some cases. For example, the range above, 1 to 65534 could be specified as:

```
0000  0000  0000  0000  deny     ;;deny 0
1111  1111  1111  1111  deny     ;;deny 65535
----  ----  ----  ----  permit   ;;permit everything else
```

A first style, where all entries are marked with the same output logic polarity (permit), as internal coding, and labels the example above, allowing both permit and deny entries, as external coding. It also uses the term code length as the number of TCAM entries required to represent a range. The internal coding style used above results in a requirement of 2W−2 entries for a W bit wide word which also refers to other work reducing the requirement to 2W−5 entries, again using only internal coding.

Generally, internal coding schemes with better results than 2W−2 require a change in the number representation of the TCAM data and the incoming word being searched. Yet other schemes have been suggested where comparators are provided to identify and encode a group of "special" ranges, with the result that the system can behave more efficiently for those specific ranges, but those systems lack generality. In addition, some of these schemes add extra bits to the TCAM range representations.

In comparison to the external coding example above, which reduced 30 entries down to 3 for that fortuitous example, another example shows the general result that using external coding, code length can be reduced to W from the 2W−2 or 2W−5 entries of internal coding. It also shows that this bound of W entries is tight; it is not possible to produce a better worst case result than W over all ranges. This factor of two reduction in code length is of course desirable, but it will be seen that it is not always possible to use external coding in every circumstance.

In the above internal coding example of range 1 to 65534, requiring 30 entries, if two fields (like TCP source and destination port numbers) each required that range, the result would require 30×30 or 900 entries to implement using internal coding. In fact, it is a common situation that ACL entries include ranges on both TCP source and destination port numbers. With multiple range dimensions, each term representing one range has to be cross-producted with every term from every other range, when internal coding is used. In general, implementing multiple dimensions of range entry using internal coding requires the product of the number of terms to implement each range. If three ranges are required, the number of terms becomes the product of the code lengths of all three. For d dimensions, the number of entries is (2W−2)**d, again using internal coding. A more efficient implementation of multiple ranges using external coding can be used. For two ranges A and B in different fields, using the notation that /A=not (A), meaning not in the range A, we have equation (1)

$$A*B=\text{not}(/A+/B).\qquad \text{Equation 1}$$

For a range A, from a1 to a2, /A is the combination of the two intervals $0<=x<a1$ and $a2<x<2W$. Intervals from 0 to some bound, or from some bound to 2W are called extremal ranges. From 0 to an upper bound is called a left extremal edge and from some bound to 2**W is called a right extremal edge. The pair of left and right extremal ranges together are called the complementary range of A. This complementary range can be implemented using internal coding with 2W−2 entries for any pair of extremal ranges constituting /A. Note that this is internal coding of the complementary range, where the action associated with matching the complementary range is deny.

A simple example will illustrate. The range 1 to 65534 has a complementary range with just two entries. If ranges A and B in different fields each have that range, the following entries are required in a table whose entries are wide enough for the two fields:

| A bit 1111 5432 | 11 1098 | 7654 | 3210 | B bit 1111 5432 | 11 1098 | 7654 | 3210 | |
|---|---|---|---|---|---|---|---|---|
| 0000 | 0000 | 0000 | 0000 | ---- | ---- | ---- | ---- | deny ;;deny A = 0 |
| 1111 | 1111 | 1111 | 1111 | ---- | ---- | ---- | ---- | deny ;;deny A = 65535 |
| ---- | ---- | ---- | ---- | 0000 | 0000 | 0000 | 0000 | deny ;;deny B = 0 |
| ---- | ---- | ---- | ---- | 1111 | 1111 | 1111 | 1111 | deny ;;deny B = 65535 |
| ---- | ---- | ---- | ---- | ---- | ---- | ---- | ---- | permit ;;permit everything else |

Note this was a simple case. In the worst case, 2W−2 entries are required for each range dimension. Note these entries are marked deny. Finally, one entry with fully wild-carded ranges is marked accept to represent the space not covered by its negative in the equation above. So the total number of entries for d dimensions of width W is multirange code length=2d(W−1)+1

For the common situation of a 16b range of a TCP port number, a maximum of 30 TCAM entries may be required to represent a complementary range. For the common situation of two ranges, each over a 16b TCP port number, a maximum of 61 TCAM entries may be required in total.

To clarify further the relationship between code length=W for one dimension, vs code length=2d(W−1)+1 for multiple dimensions, the application of external coding must be examined in more detail. At first glance, a contradiction appears by applying the 2d(W−1)+1 equation to the case of one dimension (d=1), yielding 2W−1. This is significantly worse than the equation code length=W for one dimension. The difference is that for one dimension, external coding is used, interspersing permit and deny locations in the TCAM to more efficiently implement the logic of the single range. Without external coding, code length would be 2W−2. For the multi-dimension case, external coding is used to get the complementary range of each dimension resulting in a result of deny. External coding is already used for that purpose; it cannot be reused within each dimension to reduce the code length for expressing the complementary range of that dimension. The result for each complementary range TCAM entry is already deny; reversing this (by attempting to re-use external coding) would result in an accept (or inhibiting deny). The accept would override all other TCAM entries, such as the deny results of other dimensions. In order to function correctly, the accept would have to be local in scope to the current dimension's complementary range, but TCAM functionality can't limit the scope of an output.

SUMMARY

An embodiment of the invention includes a ternary content addressable memory (TCAM) that has input search data bits, TCAM words and range search input data bits. Each TCAM word is operable to store a match pattern and provide a match output. The match output indicates a match when the match pattern of the TCAM word matches the TCAM input search data bits. The range search input data bits are separated into groups. Each group has a bit width N where N is the number of range search input data bits. For the match pattern in each group, there is a Boolean function that uses the N range of search input data bits. $(2^N)/2$ TCAM bits are provided for each TCAM word. $2^N$ internal TCAM search lines are operable to search the $(2^N)/2$ TCAM bits. Decoder logic is associated with each group that decodes the N range search input data bits.

DETAILED DESCRIPTION

Figure 1:
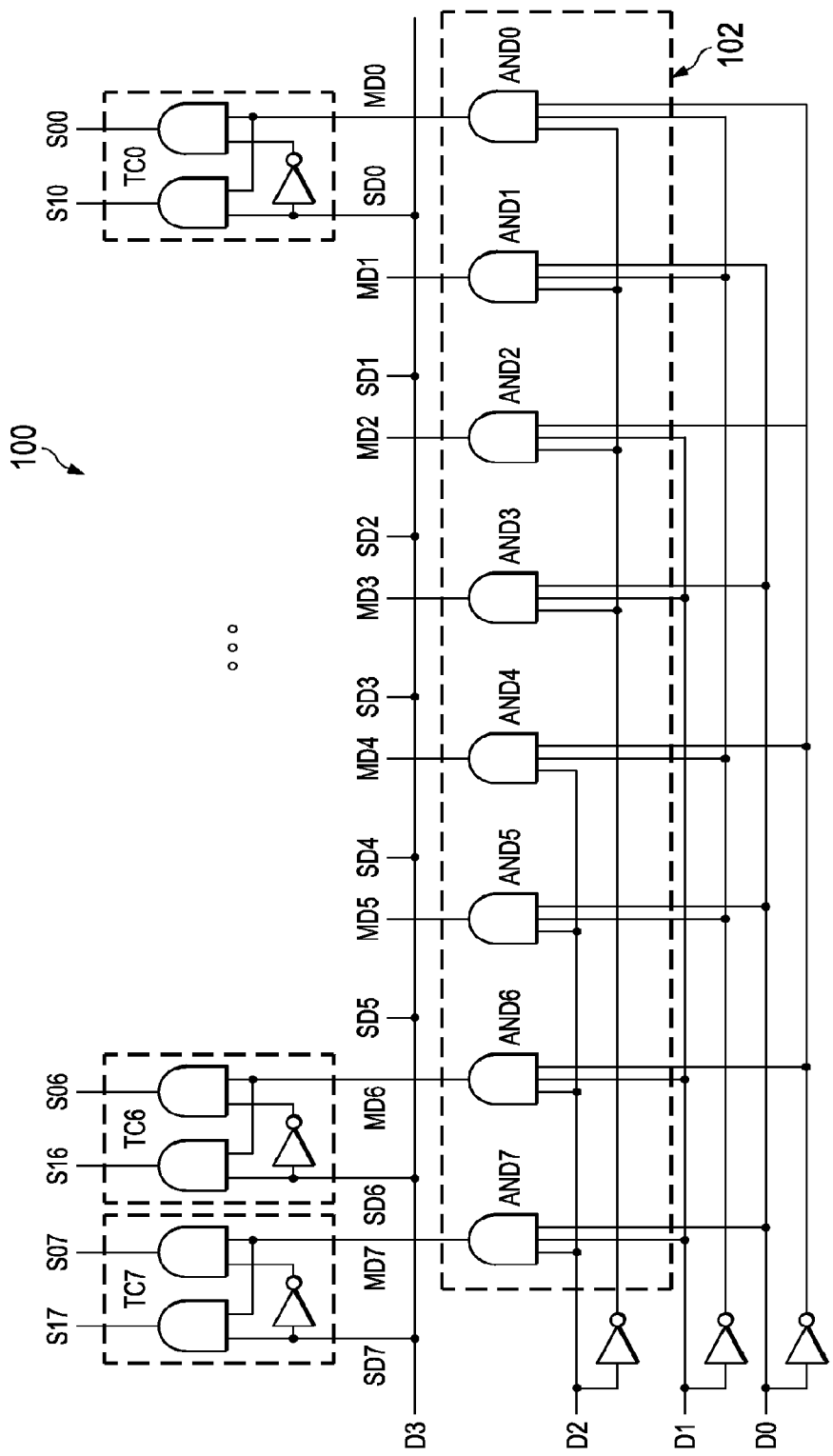
FIG. 1 is a schematic diagram of a one-hot decoding function on search line inputs of a 4 bit block size according to an embodiment of the invention.

An embodiment of the invention includes a ternary content addressable memory (TCAM) that has input search data bits, TCAM words and range search input data bits. Each TCAM word is operable to store a match pattern and provide a match output. The match output indicates a match when the match pattern of the TCAM word matches the TCAM input search data bits. The range search input data bits are separated into groups. Each group has a bit width N where N is the number of range search input data bits. For the match pattern in each group, there is a Boolean function that uses the N range of search input data bits. $(2^N)/2$ TCAM bits are provided for each TCAM word. $2^N$ internal TCAM search lines are operable to search the $(2^N)/2$ TCAM bits. Decoder logic is associated with each group that decodes the N range search input data bits.

An embodiment of the invention describes a system with a data representation change, both within the TCAM bits representing a range field and in the search bits representing that range field in the packet header. The data representation change comes with a block size, which can have multiple sizes. Two sizes will be described here, 2 bits and 4 bits, along with generalization to other block sizes. Within the block, intervals will be represented in a decoded way inside TCAM entries. For that reason, the structure is called a Decoded Interval Range TCAM, or DIRTCAM.

The 2 bit block size results in requiring no extra bits in the TCAM range representation; it requires 2 TCAM bits to represent each 2 bit block. Like conventional TCAMs, this structure can use external coding, but while for some ranges it reduces code size, it does not reduce code size in the worst case. An embodiment of the invention using the 2 bit block size reduces code length from the prior art 2W−2 for internal coding or W for external coding (described above) to W−1 for both internal and external coding styles.

The 4 bit block size results in requiring 2× the bit-width in the TCAM to represent a range. For example, 4 bits of a range field require 8 bits of TCAM width. If all 16 bits of a range were implemented with 4 4-bit blocks, the TCAM width to represent this range would expand from the original 16 bits to 32 bits. An implementation using the 4 bit block size reduces code length from the prior art 2W−2 for internal coding or W for external coding (described above) to W/2−1. For example, in the standard TCP 5-tuple, the 2 16b TCP source and destination port numbers typically have ranges, but the 2 32b IP source and destination addresses, and the 8b IP protocol may not. If both TCP source and destination address fields are implemented with the 4 bit blocks, a total of 32 bits are added to the original 104b, increasing width by 30% but halving the number of words in the worst case with a total bit-count equal to 65% of the 2 bit block version. Additionally, when implementing multiple dimensions, the 4 bit block results in half the entries for each dimension.

An implementation of the block algorithm takes an N bit block of search input bits and decodes the block into a 1-hot field of $2^N$ bits, where if the data value of the N bit input is equal to K, bit K of the $2^N$ output bits is true and all other bits are false. The N bits of data input are applied to $(2^N)/2$ bits of TCAM match word. Recall that each bit of a TCAM word actually stores two bits to represent the ternary entry. Therefore, this $(2^N)/2$ bit wide TCAM field actually contains $2^N$ memory bit cells per word. The $2^N$ bits in the TCAM field represent the $2^N$ possible values of the N bit search word block, with one TCAM memory bit-cell assigned to each possible value of the N bit search block. The values of these $2^N$ bits can be set to a map of the allowed vs. disallowed values of the search input data for that block.

Conventional TCAMs operate using two search lines per bit of width. One of these is true to represent a search bit value of 1 while the other is true to represent a search bit value of 0. A search value of don't-care is applied by making both search bits false. TCAM bit-cells contain two TCAM memory bit-cells and some comparison logic. One memory bit-cell stores a true value if the TCAM search data is 1 while the other memory bit-cell stores a true value if the TCAM search data is 0. If the TCAM search data is a don't-care, both TCAM memory bit-cells values are 0. The TCAM bit-cell generates a bit-mismatch result using the following logic:

S0=search line 0

S1=search line 1

B0=TCAM memory bit-cell 0

B1=TCAM memory bit-cell 1 bit-mismatch=(S1 and B0) or (S0 and B1)

Note that from the logic above, if either S0 and S1 are both false or B0 and B1 are both false, bit-mismatch is always false, so the bit effectively doesn't participate in the match operation.

Further logic associated with each TCAM word entry performs the logic operation "OR" on all bit-mismatch signals to indicate a word-mismatch signal which is then logically complemented to output a word-match signal.

From the above descriptions of TCAM operation and the DIRTCAM block algorithm, if $(2^N)/2$ TCAM bits of width are ganged together, providing $2^N$ TCAM memory bit-cells and $2^N$ search lines, the block-mismatch signal produced by performing the logical function "OR" on all the TCAM word's bit-mismatch signals in the block is just the OR of $2^N$ logical function "AND" terms with each AND term being the AND of a search bit value and a TCAM memory bit value. Search bit K will be true for an input search value of K, so if the TCAM entry should match for value K the particular TCAM bit-cell ANDed with search bit K will have a logical value of 0. If the TCAM entry should mismatch for value K, the particular TCAM bit-cell ANDED with search bit K will have a logical value of 1.

An example will be provided for block size 4. Here, $(2^N)/2$=8 TCAM bit-cells are used, each with a B0 and B1 bit-cell. The TCAM bit-cells are indexed 7 down to 0, with B0 for the 8 cells storing match indications for search values=7 down to 0, and with B1 for the 8 cells storing match indications for search values=15 down to 8.

| TCAMbit | 7 | 6 | 5 | 4 | 3 | 2 | 1 | 0 |
|---|---|---|---|---|---|---|---|---|
| B1 | =15 | =14 | =13 | =12 | =11 | =10 | =9 | =8 |
| B0 | =7 | =6 | =5 | =4 | =3 | =2 | =1 | =0 |

These 16 memory bit-cells are capable of storing any possible match/mismatch function of 4 search input bits. Some examples follow:

| tcam | 111111 | |
|---|---|---|
| memory bit | 5432109876543210 | |
| function | | |
| range 4 to 15 | 1111111111110000 | ;=1=pass |
| range 1 to 3 | 0000000000001110 | |
| odd | 1010101010101010 | |
| 4bit xor | 0110100110010110 | |

Note that these bit-cells can not only store functions equivalent to ranges, but can store any Boolean function of the 4 search bits. For clarity, a 1 entry indicates pass while a 0 indicates fail. The complement of this 16 bit vector is stored into the TCAM memory bit-cells where a 1 in the memory bit-cell contributes to a mismatch causing a fail.

Another way of describing the function of the memory bit-cells' contents is to state that a stored positive logic 1, equal to a stored negative logic value of 0 in the actual bit-cell, represents a match enabling value stored in the TCAM memory bit-cell. Likewise, a stored positive logic value of 0, equal to a stored negative logic value of 1 in the actual memory bit-cell, represents a match disabling value stored in the TCAM memory bit-cell.

In general, if the 16 TCAM bit-cell values are labeled M<15:0> (M for match), and the desired match function of the 4 bit input data block D<3:0> is f(D<3:0>) for that TCAM entry, then for any bit-cell M<i> in bit position i, it will be programmed with a value f(i). Again, note that "programmed" refers to the positive logic function logical value representing a match enabling value, while the actual TCAM memory bit-cell contents would be the negative logic values.

A logic diagram of the one-hot decoding function on the search line inputs for a 4 bit block size is shown in FIG. 1. A TCAM bit TC7, which for each bit has two inputs: a search data bit SD7 and a match enable bit MD7 is used. Search bit decoding logic internal to the TCAM is shown for bit 7 of the block, where S17 bit is a logical high value when SD7 is a logical high value and when MD7 is a logic high value, otherwise S17 is a logical low value. S07 bit is a logical high value when SD7 is a logical low value and MD7 is a logical high value, otherwise S07 is a logical low value. Conventional TCAMs may have logic which differs from this, for example by inverting the polarity of search data or mask input bits, or by directly providing S17 and S07 search bits as inputs, requiring the user to implement the above described logic externally, but it is recognized that these differing implementations all still reflect the function described above, whether implemented in a different way or whether implemented external to the TCAM.

To implement the one-hot decoding function required by the block algorithm shown in FIG. 1, block search data bit, D3 is connected to the TCAM search data inputs SD7, SD6, SD5, SD4, SD3, SD2, SD1 and SD0 of all TCAM bits TC7-TC0 respectively in the block. When D3 is a logical high value, only the search lines S17, S16, S15, S14, S13, S12, S11 and S10 of each TCAM bit TC7-TC0 respectively are enabled, corresponding to search values from 8 through 15. When D3 is a logical low value, only the search lines S07, S06, S05, S04, S03, S02, S01 and S00 of each TCAM bit TC7-TC0 respectively are enabled, corresponding to search values from 0 through 7. The other three search data bits, D2-D0 go to eight three input ANDs, AND7-AND0, which acts as a decoder 102 for the search bits D2-D0. One bit of the decoder's 102 output MD7, MD6, MD5, MD4, MD3, MD2, MD1 and MD0 will be a logically high value and enable one bit from bit S17, S16, S15, S14, S13, S12, S11 and S10 when D3 is a logical high value or enable one bit from bit SD7, SD6, SD5, SD4, SD3, SD2, SD1 and SD0 when D3 is a logical low value.

If the logic of the decoder 102 is combined with the TCAM's search bits TC7-TC0 decoding logic, the function of the combined block 100 is a 4 bit to 1 of 16 bit decoder, translating each possible value of the inputs D3-D0 into a single logical high value output on the combined group of S17-S10 and S07-S00 bits. It is recognized that no matter what the exact nature of the two search inputs provided to each TCAM bit, the overall function can be made a 4 bit to 1 of 16 bit decoder with appropriate external logic.

Figure 2:
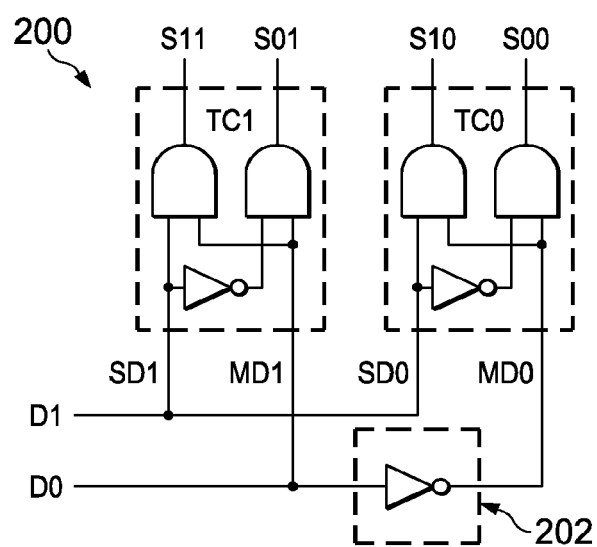
FIG. 2 is a schematic diagram of a one-hot decoding function on search line inputs of a 2 bit block size according to an embodiment of the invention.

FIG. 2 is a schematic of a one-hot decoding function 200 on search line inputs of a 2 bit block size according to an embodiment of the invention. With a 2 bit block size instead of a 4 bit block size, decoder 202 is an inverter instead of 8 three-input ANDs. The functional logic of TCAM bits TC1 and TC0 remains the same as the previously described TCAM bits in FIG. 1. In this example, data bit D1 drives search data bits SD1 and SD0. Data bit D0 drives mask input bit MD1 and the input to decoder 202. The outputs of TCAM bit TC1 are S11 and S01. The outputs of TCAM bit TC0 are S10 and S00.

The choice of bit assignments in FIG. 1, where the msb D3 drives all TCAM search bits and the lsbs, D2-D0 that drive the decoder 102 is arbitrary. A different bit, such as D0 could equivalently instead drive all TCAM search bits, with the remaining bits D3-D1 driving the decoder 102. This would result in a different mapping function of the TCAM memory bit-cells to values of input search block data.

The multiple options for assigning different input bits to the 4 bit to the decoder 102 along with the associated different mappings of TCAM memory bit-cells to search values can be stated in a general way by referring to the language used for automatic test pattern generation (ATPG) used for providing test vectors to test on-chip logic. In order to test a particular signal of interest, it must have a path to an observable output signal (usually a flip-flop observed via scan), and the path from that signal to the output must be sensitized. Sensitizing the path from a signal to an output, or more briefly, sensitizing the signal, requires setting logic values on other signal inputs to the cone of logic producing the output signal, so that a change in the value of the signal of interest produces a change in value of the output signal. If, for a 4 bit block, the 16 search signals are S<15:0> and the 16 TCAM memory bit-cell values are M<15:0>, the mismatch signal logic equation is:

mismatch=$S<0>M<0>+S<1>M<1>+S<2>M<2>+S<3>M<3>\ldots+S<15>M<15>$ where multiplication indicates a Boolean AND operation, and a "+" indicates a Boolean OR operation. Since the search signals S<15:0> are produced by a 4 bit to 1 of 16 decoder, exactly one of them will be a logical high value, with the others being logical low values. In that case, all OR terms in the above equation evaluate to zero except the one with the high value on the search line. For each of the $2^N$ values of the N input bits for a block, one and only one TCAM memory bit-cell will be a logical high value.

As an example of how the maximum code length for a range of width W is W/2−1 for block size 4 (2W/B−1 for width W and block size B bits), an algorithm for creating DIRTCAM entries for any range will be described. It will be assumed that the width W is a multiple of the block size B, which is true for W=16 and B=4. If it is not, the number of blocks W/B is rounded up to the next integer, with a smaller block size implementing the leftover bits. For example, an 18 bit range could be implemented as 4 blocks of 4 bits and 1 block of 2 bits. Let a range be described by a low limit L and a high limit H. Note that the range includes the values of L and H, as opposed to up to but not including H. The W bit representation of ranges will be separated into W/B digits, each B bits long. Digits of the range limits L and H will be referred to as LD and HD.

Starting with the most significant digit, if the hi limit most significant digit HD<msb> is equal to the low limit most significant digit LD<msb> then the algorithm recurses downward to the H and L values starting at the next digit, and any TCAM entries returned (which will only have values for the lower digits) get the HD<msb>=LD<msb> value placed into them for the most significant digit.

For example, with the values of H and L below (both written in hex, the 0x prefix will be omitted for readability when it is obvious the number is in hex),
W=16
H=5cff
L=5a00
the algorithm recurses to the next digit:
W=12
H=cff
L=a00
and the value returned from the 12b recursion
a-c - -; 12b returned value
gets the most significant digit concatenated to it:
5 a-c - -; 16b returned value In general, the algorithm can be described so that the recursion at the 12 bit level only returns a 12 bit wide set of TCAM entries, and once the call to the 12 bit recursion level returns back to the caller at the 16 bit level, the 4 msb's are attached, as shown above. Or, more simply, it can be considered that when recursing to the 12 bit level, that level knows it must return a full width result, and so fills in the TCAM entry values for the 4 msb's from the value of LD<msb>. In the discussion below, it is assumed that recursions at any level always provide full width values for any TCAM entries they create.

At the 12 bit level, only one TCAM entry need be returned. The returned value specifies allowed values for each of the 3 digits in the 12 bit width, plus the 4 msbs of LD<msb>. Value a-c for the most significant digit (at the 12b level) specifies that a match is returned for values from a to c (hex), namely, a, b and c. The -, or don't care value for the other two digits indicate that any value is legal. So the (positive logic) function values for the four digits are:

| Value | 1111 | 11 | | |
| Value digit | 5432 | 1098 | 7654 | 3210 |
| --- | --- | --- | --- | --- |
| <15:12> | 0000 | 0000 | 0010 | 0000 |
| <11:8> | 0001 | 1100 | 0000 | 0000 |
| <7:4> | 1111 | 1111 | 1111 | 1111 |
| <3:0> | 1111 | 1111 | 1111 | 1111 | where a 1 in a value position for a digit specifies that that value is allowed for that digit (and the negative logic value actually contained by the TCAM memory bit-cell is 0).

Another example will allow further description of the algorithm:
W=16
H=8d77
L=5001

Here, an examination of the Boolean space of the range separates it into three portions. For the region where the most significant digit=5, the range starts at 5001, not 5000, so it doesn't cover all the Boolean subspace of LD<msb>=5. This lower subrange is a right extremal range, from the range lower limit to the top of the Boolean space of LD<msb>=5, i.e., from 5001 to 5fff. This right extremal range will form the first portion of the TCAM entries for this range.

Next, for the most significant digit, the Boolean subspaces where the most significant digit has values 6 and 7 are fully contained in the range. This middle portion of the range can be covered with a single TCAM entry, with range values set (from 6 through 7) for the most significant digit, and don't cares for less significant digits. This middle subrange will form the second portion of the TCAM entries for this range.

Finally, the range covers only a portion of the Boolean space where the most significant digit=8, in this case from d00 to d77. This upper subrange is a left extremal range, from the bottom of the Boolean space with the most significant digit=8 to the top of the range H. This left extremal range will form the third portion of the TCAM entries for this range.

In summary, and before moving on to more detail about how to produce the TCAM entries for each of the three portions of the TCAM entries, first there is a lower subrange, a right extremal range from L up to the top of the Boolean subspace defined by the value of LD<msb>. Then there is a middle subrange, a single entry representing a range specified only by the most significant digit, with all lower digits being don't cares. Finally there is an upper subrange, a left extremal range, from the bottom of the Boolean subspace defined by the value of HD<msb> to H. These three subranges will be referred to as the lower subrange, the middle subrange and the upper subrange.

All these three subranges are optional, and may be omitted in some circumstances. In the case where the range low limit L has 0's in all less significant digits:
W=16
H=8d77
L=5000
then the bottom of the range is at an even location, starting at a boundary of the Boolean subspaces defined by the values of the most significant digit. Thus, the middle subrange covers the space all the way down to L, in this case, from 5000 to 8000. The lower subrange, the right extremal range, is empty and is omitted.

In other cases, the middle portion of the range is empty:
W=16
H=6d77
L=5001

Here the lower subrange covers all values with the range<msb>=5, while the upper subrange covers all values with the range<msb>=6. The space between them is empty because the range doesn't cover the full Boolean space defined by any value of range<msb>.

In other cases, the upper portion of the range is empty:
W=16
H=8fff
L=5001

Here, the middle subrange covers from 6000 to 8fff, all the way to H, so the upper subrange is empty. If all digits of H other than the most significant digit are all 1's (f's in hex), then there is no upper subrange, because the upper limit of the range ends at a boundary which includes a full Boolean subspace defined by a value of HD<msb>.

Summarizing the conditions under which the three subranges are present or not, if the full Boolean space is divided into subspaces by the values of range<msb>, if the lower limit L starts on an even boundary of one of these Boolean spaces, there is no fractional portion of Boolean space below it to fill with a right extremal range, so there will be no lower subrange. If the upper limit H lies on an even boundary of one of these Boolean spaces, there is no fractional portion of Boolean space above it to fill with a left extremal range, so there will be no upper subrange. Finally, if the upper and lower subranges have adjacent values for the most significant digit, there is no middle subrange.

Outputting the lower subrange is done by a recursion starting with the next to most significant digit. Let the value of L for that digit be L<d>. If all bits of L below that digit are 0, or there are no less significant digits, the range starts on an even boundary of that digit. In that case, terminate the recursion and for that digit output a range from L<d> to the max value for that digit (max=15 for 4 bit blocks) with don't cares for all lower digits, and L's value for all more significant digits. For example:
W=16
H=6d77
L=5100

The lower subrange recursion starts at the next most significant digit:
W=12
L=100

Here, all less significant digits are 0, so output a range of 1 to 15 (L<d>=1 to max) for that digit and don't cares for lower digits, also with L's value for the most significant digit:
Return 5 1-15- -; 16b returned value from width 12 recursion If, on the other hand, when at width 12 the less significant digits are not zero:
W=16
H=6d77
L=5124
at width 12:
W=12
L=124 then the Boolean subspace where L<msb>=1 is not fully in the range and an upper subrange is required, so start the recursion at the next to most significant digit. Output a TCAM entry with a range from 1+L<d> to max(15 for B=4). Output L's value for more significant digits and don't cares for less significant digits. If L<d> is max, don't output a range and then recurse to the next lower digit, which will output more entries. The recursion is shown here to the bottom:

```
at width 12:
W = 12
L = 124
Output        5    2-15    —       —       ;from recursion at width 12
recurse:
W = 8
L = 24
Output        5    1       3-15    —       ;from recursion at width 8
recurse:
W = 4
L = 4
Output        5    1       2       4-15    ;from recursion at width 4
collected returned values:
output        5    2-15    —       —       ;from recursion at width 12
output        5    1       3-15    —       ;from recursion at width 8
output        5    1       2       4-15    ;from recursion at width 4
```

At each level, one TCAM entry may be added, so for a 16 bit (4 digit) width, the lower subrange may contain up to 3 TCAM entries. Recall that the recursion starts from the next to most significant digit. Each of the 3 terms covers a range in one digit with specific values for more significant digits, and don't cares for less significant digits.

Outputting the upper subrange, a left extremal range, uses a similar algorithm to the lower subrange.

Outputting the upper subrange is done with a recursion starting with the next to most significant digit. Let the value of H for that digit be H<d>. If all bits of H below that digit are 1's (hex digits are f's), or there are no less significant digits, the range upper boundary ends on an even boundary of the most significant digit of H. In that case, terminate the recursion and for that digit output a range from 0 to H<d> with don't cares for all lower digits, and H's value for all more significant digits. For example:
W=16
H=6cff
L=5100

The upper subrange recursion starts at the next most significant digit:
W=12
H=cff Here, all less significant digits are fs, so output a range of 0 to c=H<d> for that digit and don't cares for lower digits:
Return 6 0-c - -; 16b returned value from width 12 recursion If, on the other hand, when at width 12 the less significant digits are not fs:
W=16
H=6c89
L=5100
at width 12:
W=12
H=c89 then the Boolean subspace where H<msb>=6 is not fully in the range, and an upper subrange is required, so start the recursion at the next to most significant digit. Output a TCAM entry with a range from 0 to H<d>−1, 0 to b in this example. Output H's value for more significant digits and don't-cares for less significant digits. If H<d> is 0, don't output a range and then recurse to the next lower digit which will output more entries. The recursion is shown here to the bottom:

```
at width 12:
W = 12
H = c88
output 6      0-b     —       —       ;from recursion at width 12
recurse:
W = 8
H = 88
output 6      c       0-7     —       ;from recursion at width 8
recurse:
W = 4
H = 8
output 6      c       8       0-8     ;from recursion at width 4
collected returned values:
output 6      0-b     —       —       ;from recursion at width 12
output 6      c       0-7     —       ;from recursion at width 8
output 6      c       8       0-8     ;from recursion at width 4
```

The middle subrange output specifies a range starting from a lower limit LL equal to L<msb> if all lower bits of L are 0 and no lower subrange is output, otherwise equal to L<msb>+1. The upper limit UL of the middle subrange is equal to H<msb> if all lower bits of H are 1's (all lower digits are fs for B=4) and no upper subrange is output, otherwise UL=H<msb>−1. If LL> UL no middle range is output, otherwise a range from LL to UL is output on the most significant digit, with all lower digits being don't cares. For example:
W=16
H=7fff
L=5000
output 5-7 - - -; output middle range With a number of digits D=W/B, the recursions for the lower and upper subranges iterate over all digits but the most significant, each potentially producing one TCAM term. So each produces W/B−1 terms, which together with the middle subrange term, produce a total number of TCAM terms:
code length=2(W/B−1)+1=2W/B−1
code length=W/2−1; for B=4
code length=W−1; for B=2

A final example illustrates outputting lower, middle and upper subranges together:

| W = 16 H = 9ace L = 3579 | | | | | |
|---|---|---|---|---|---|
| Output | 9 | a | c | 0-e | ;upper subspace |
| Output | 9 | a | 0-b | — | ;upper subspace |
| Output | 9 | 0-9 | — | — | ;upper subspace |
| Output | 4-8 | — | — | — | ;middle subspace |
| Output | 3 | 6-f | | | ;lower subspace |
| Output | 3 | 5 | 8-f | — | ;lower subspace |
| Output | 3 | 5 | 7 | 9-f | ;lower subspace |

Here is a table of the number of TCAM entries required for various common TCP port ranges, for prior art internal coding and external coding approaches, as well as the DIRTCAM 4 bit block and DIRTCAM 2 bit block approaches. Even though some of the ranges are simple and require only a small number of entries even for conventional approaches, when summed across all cases the 4 bit DIRTCAM approach results in a significant reduction of total number of words required vs. both internal coding and external coding conventional approaches. The 2 bit DIRTCAM approach yields improvement vs the conventional internal coding approach.

| lo | hi | lo(hex) | hi(hex) | conv-int | conv-ext | dirt4 | dirt2 |
|---|---|---|---|---|---|---|---|
| 16384 | 16480 | 4000 | 4060 | 3 | 3 | 2 | 3 |
| 1024 | 65535 | 400 | ffff | 6 | 3 | 2 | 3 |
| 6970 | 7070 | 1b3a | 1b9e | 8 | 5 | 3 | 6 |
| 2000 | 3467 | 7d0 | d8b | 7 | 7 | 4 | 5 |
| 1023 | 1340 | 3ff | 53c | 7 | 5 | 4 | 5 |
| 0 | 1022 | 0 | 3fe | 10 | 3 | 3 | 5 |
| 0 | 1023 | 0 | 3ff | 1 | 1 | 1 | 1 |
| 1001 | 65535 | 3e9 | ffff | 10 | 7 | 4 | 6 |
| 33554 | 65535 | 8312 | ffff | 11 | 5 | 4 | 7 |
| 0 | 33432 | 0 | 8298 | 6 | 6 | 4 | 6 |
| 256 | 512 | 100 | 200 | 2 | 2 | 2 | 2 |
| 768 | 2047 | 300 | 7ff | 2 | 2 | 1 | 2 |
| 6000 | 6064 | 1770 | 17b0 | 4 | 4 | 2 | 3 |
| 512 | 1536 | 200 | 600 | 3 | 3 | 2 | 3 |
| 109 | 110 | 6d | 6e | 2 | 2 | 1 | 1 |
| 1645 | 1646 | 66d | 66e | 2 | 2 | 1 | 1 |
| 33434 | 33524 | 829a | 82f4 | 7 | 7 | 3 | 6 |
| 6660 | 6669 | 1a04 | 1a0d | 3 | 3 | 1 | 2 |
| 6000 | 6099 | 1770 | 17d3 | 4 | 4 | 2 | 4 |
| 20 | 2511 | 14 | 9cf | 12 | 6 | 4 | 8 |
| TOTALS: | | | | 110 | 80 | 50 | 79 |

Now this DIRTCAM code length formula can be applied to cases with multiple dimensions. For multiple dimensions, using internal coding,
code length=(2W/B−1)**d
code-length=(W/2−1)**d; for B=4
code-length=(W−1)**d; for B=2

This exponentiation occurs because each term in a dimension must be cross-producted with every term in every other dimension.

If external coding is allowed, instead of coding for a range in a dimension, the complementary range may be encoded instead, specifying a result of deny, and the complementary range results of all dimensions are or'ed together. Finally, a single wildcard default entry with result=permit covers the Boolean space leftover from all the dimensions' complementary ranges. Specifying a complementary range (using internal coding within) requires the same number of entries as specifying the range itself. So:

For multiple dimensions, using external coding,
code-length=d(2W/B−1)+1
code-length=d(W/2−1)+1; for B=4
code-length=d(W−1)+1; for B=2

The code length for a complementary range is the same as that for a range because it uses the same three subranges. There is a left extremal range covering the irregular Boolean space from an even boundary of LD<msb> up to but not including the range's lower limit L. There is a right extremal range covering the irregular Boolean space from just above the range's upper limit H up to an even boundary of HD<msb>, and there is a middle range. In this case, the middle range starts above the right extremal range, goes up to the max range, wraps around and then goes up to the lower boundary of the left extremal range. Wrapping around makes no difference to the middle range, which is just an enumeration of valid values for the range's most significant digit. For example:

| W = 16 H = 7abd ;this is the range, not the complementary range L = 5246 ;this is the range, not the complementary range | | | | | |
|---|---|---|---|---|---|
| Output | 7 | b-f | — | — | ;right extremal range |
| Output | 7 | a | c-f | — | ;right extremal range |
| Output | 7 | a | b | e-f | ;right extremal range, starts at 1 + 7abd |
| Output | 5 | 0-1 | — | — | ;left extremal range |
| Output | 5 | 2 | 0-3 | — | ;left extremal range |
| Output | 5 | 2 | 4 | 0-5 | ;left extremal range, ends at 5246-1 |
| Output | 0-4, 8-f | — | — | — | ;middle subspace, 8 to f then 0 to 4 |

Note that for the middle subspace, it goes from 8 to f, wraps around and goes from 0 to 4, yet still requires only one TCAM entry.

A TCAM can be flexibly configured to operate in multiple modes. For example, it can operate as a DIRTCAM with 4b blocks, as a DIRTCAM with 2b blocks, or as a conventional TCAM. Each byte of a TCAM can be independently configurable between those choices. For example, for each byte, four modes are possible:
4b DIRTCAM, hi 4b of input byte
4b DIRTCAM, lo 4b of input byte
2b DIRTCAM
conventional TCAM If data is presented to a TCAM in a configurable way, on a byte granularity, for example, according to U.S. patent application Ser. No. 14/072,989 "An Openflow Match and Action Pipeline" herein incorporated by reference, with each byte configurable to be sourced from any byte of a packet header vector, each byte of the TCAM can be configured to operate on an input search byte either as a conventional TCAM or as a DIRTCAM with 2b blocks by selecting the match data input to that byte using a two input multiplexer, where one multiplexer data input would be the input search byte, and the other would be four copies of the two bit block decoder 202 shown in FIG. 2 with two input search byte bits fed to each copy of the decoder.

Figure 3:
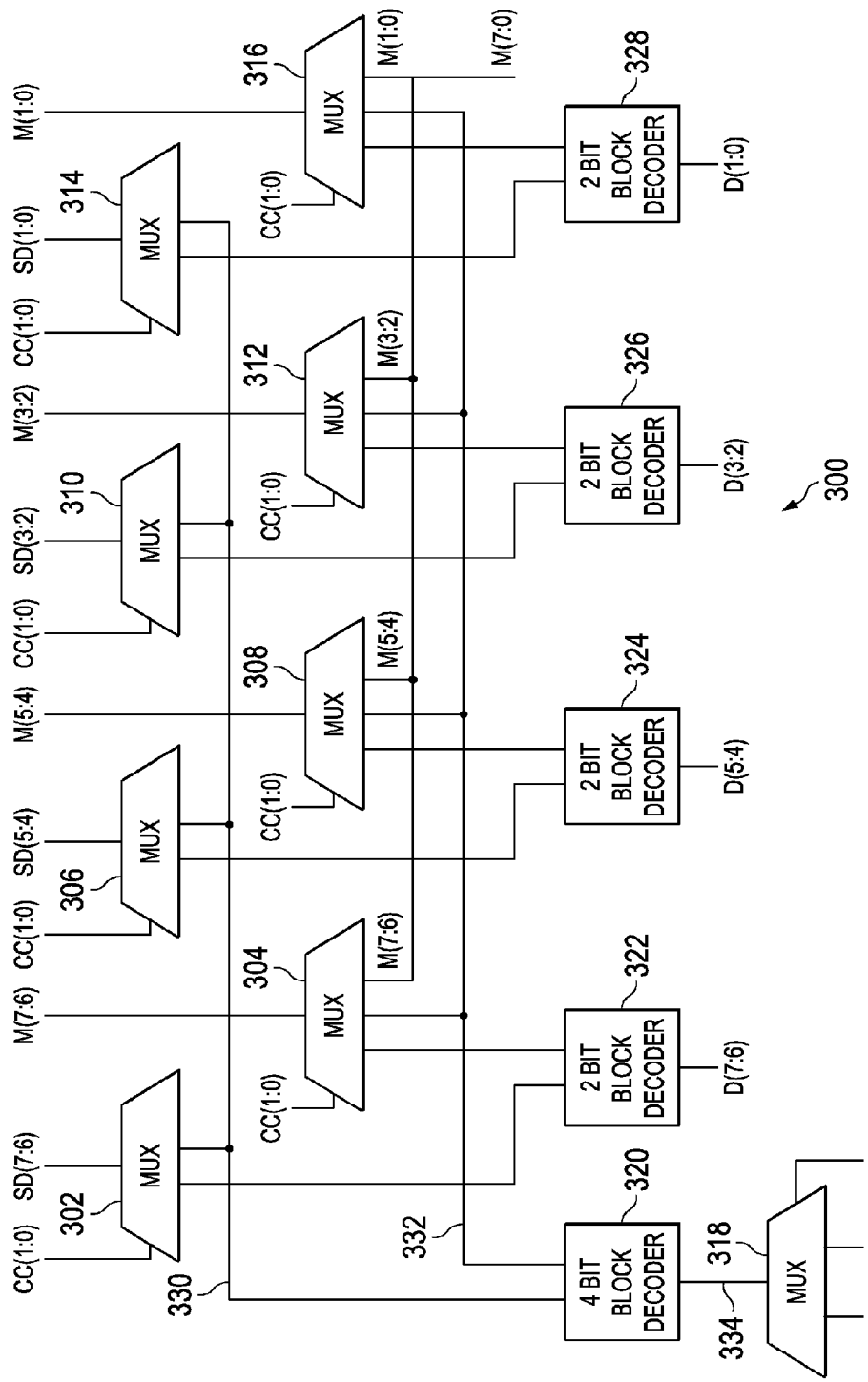
FIG. 3 is a schematic diagram illustrating 4 modes of operation, conventional TCAM, 2 bit DIRTCAM, 4 bit DIRTCAM using lo 4 bit of byte, and 4b DIRTCAM using hi 4 bit of byte according to embodiments of the invention.

With 4 bit block size DIRTCAM operation, 4 bits of search data input feed each byte of TCAM. Each byte of input search byte data can be provided to the TCAM at two different byte locations. One byte location would use the lower 4 bits of the input search byte data, while the other byte location would use the upper 4 bits of the input search byte data. The lower and upper 4 bits of input search byte data could be multiplexed together to provide input to the 4 bit block decoder 102 of FIG. 1 which forms a third multiplexing input to the TCAM match data input. An arrangement 300 which provides 4 modes of operation, conventional TCAM, 2 bit DIRTCAM, 4 bit DIRTCAM using lo 4 bit of byte, and 4b DIRTCAM using hi 4 bit of byte is shown in FIG. 3. A configuration control word CC(1:0) operates as follows:

| 4b/2b/normal configuration programming | |
| --- | --- |
| CC(1:0) | configuration |
| 3 | 4b DIRTCAM, hi 4b of byte |
| 2 | 4b DIRTCAM, lo 4b of byte |
| 1 | 2b DIRTCAM |
| 0 | conventional TCAM |

When CC(1:0)=0, eight 3-input multiplexers (MUX) 302-316 on TCAM search data inputs SD(7:6), SD(5:4), SD(3:2), SD(1:0) and mask inputs M(7:6), M(5:4), M(3:2), M(1:0) select the provided input data D(7:4), D(3:0), D(7:6), D(5:4), D(3:2), D(1:0) and mask M(7:6), M(5:4), M(3:2), M(1:0). When CC(1:0)=1, 2 bit DIRTCAM mode is selected and the eight three-input multiplexers (MUX), 302-316, select the outputs of the four 2b block decoders 322-328, each of which is sourced from a different set of 2 bits from the provided input data D(7:4), D(3:0), D(7:6), D(5:4), D(3:2), D(1:0). When CC (1:0)=2 or 3, the eight three-input multiplexers (MUX) 302-316 select the output 330 and 332 of the 4 bit block decoder 320. The input 334 of the 4 bit block decoder 320 is provided through a 2-input multiplexer (MUX) 318, controlled by CC(0), selecting D(7:4) as input when CC(0)=1, otherwise selecting D(3:0) as input. In this way, with a 2 bit configuration control field CC(1:0) for each TCAM byte, each TCAM byte can be independently configured into the 4 above modes.

As an example, for the standard TCP 5-tuple, if the 2 16 bit TCP port number fields used ranges and the other 3 fields did not, and 4b DIRTCAM operation were desired for those 2 TCP port number fields only, the 104 bit width of the TCAM would be expanded by 32 bits, and an extra copy of each of the 16 bits TCP port number fields would be input to the TCAM. For the other three fields (IP source, destination, and protocol), TCAM bytes receiving those inputs would be configured to operate in conventional TCAM mode. For the TCAM bytes receiving one copy of the TCP port numbers, those TCAM bytes would be configured to operate in 4 bit DIRTCAM mode selecting the lo 4 bits of each byte, while for the TCAM bytes receiving the other copy of the TCP port numbers, those TCAM bytes would be configured to operate in 4 bits DIRTCAM mode selecting the hi 4 bits of each byte. Note that there is no special requirement for the locations of the two different copies of each of the two TCP port numbers. They could be adjacent or at any arbitrary locations. If internal coding were used for the TCP port numbers, the maximum number of TCAM entries required for a two dimensional range cross range would be 49. When external coding is used, the maximum number of TCAM entries required for a two dimensional range cross range would be 15.

Note that in this discussion of configurability, 2 bit and 4 bit block size DIRTCAM architectures were included, as they have been in previous discussions. Other block sizes are also possible. For example, with a 3 bit block size, 3 bits of search data input would map to $(2^3)/2=4$ bits of TCAM width, a 4/3 expansion. Mapping a 16 bit field to four 3 bit blocks and one 4 bit block would require 24 total TCAM bits, with ranges mapping to a maximum of 9 entries. Mapping a 16 bit field to five 3 bit blocks and one conventional bit would require 21 TCAM bits, with ranges mapping to a maximum of 10 entries. There are 10 entries rather than 11 because if the field msb is the conventional bit, there is no middle subrange in the expansion. As another example, a 5 bit block size would require 16 TCAM bits.

Other variations in configuration are possible. For example, while for one of the 4 bit DIRTCAM modes, for example the 4 bit lo mode, the input data could use the lo 4 bits of the incoming search data byte. When in 4 bit hi mode, it could be alternately configured to use the high 4 bits of an adjacent byte's input search data. Then the input search data would only have to be presented to the TCAM once.

It is not always possible to use external coding even in the case of a single range field. It can be used for a range rule only if that rule has no overlapping Boolean subspace with any other rule. Rules are not necessarily written that way. They are simply written in prioritized order with the first matching rule applying. For example, for a particular choice of the other 3 fields, (IP source, destination, protocol), even considering only one TCP port number, there may be multiple rules which specify different ranges which may be overlapping or non-overlapping. As another example, rules may specify particular IP addresses but other rules may specify overlapping IP addresses such as ones with a different number of lsb wild-card bits. In this example, there may be a number of exact match IP addresses (all 32 bits specified without any wild-cards) followed by rules with wild carded IP addresses in some bits to catch remaining entries. In all those cases, rules can only specify permit results, not deny, because they can make no assumptions about what lies outside the Boolean subspace exactly specified by the rule.

While using external coding may be very desirable, especially for multiple range fields, the processing necessary to verify that rules are non-overlapping may be substantial. Or alternatively, such processing may have to separate rules into distinct groups, with no overlap between groups but overlap allowed within the groups. More complex processing then works on each separate group, possibly producing external coding for that group. In general though, the implication of such processing is that any change in a single rule may cause a large amount of processing to determine its interaction with all other rules or to determine changes in interactions between other rules because of the change in the Boolean space the new rule is covering or not covering. So the ability to use external coding comes at a significant cost in both algorithm complexity and possible runtime performance. If such processing is not implemented there may be no choice but to use only internal coding with its multiplicative code length results for multiple range fields.

As a result, a system which produces an improvement for multiple ranges has a more significant impact than just that suggested by comparison vs. best possible prior art approaches. The best prior art approaches may not be usable in many cases. Internal coding may be the only allowed style.

The multiple field range problem with internal coding stems from the cross product of multiple ranges, such as a range A in a field which expands using internal coding into a number of TCAM terms A0, A1, etc, cross-producting with a range B in a field which expands using internal coding into a number of TCAM terms B0, B1, etc:

(A0+A1+A2 ... )(B0+B1+B2 ... ).

In an embodiment of the invention, a structure is presented which expresses the above in a more efficient way. If the TCAM for the multiple ranges is split into separate TCAMs for each range, then the outputs of the first TCAM could be or'ed together before inputting to the second TCAM. Conventional TCAMs can allow chaining, where the match line outputs of one TCAM feed into logic which enables the corresponding match lines of a second TCAM. This is a technique to combine TCAMs for the purpose of achieving a wider data word width. But for the purpose of improving multiple range efficiency, before this chaining occurs, the desired match outputs from the first TCAM must be or'ed together.

Figure 4:
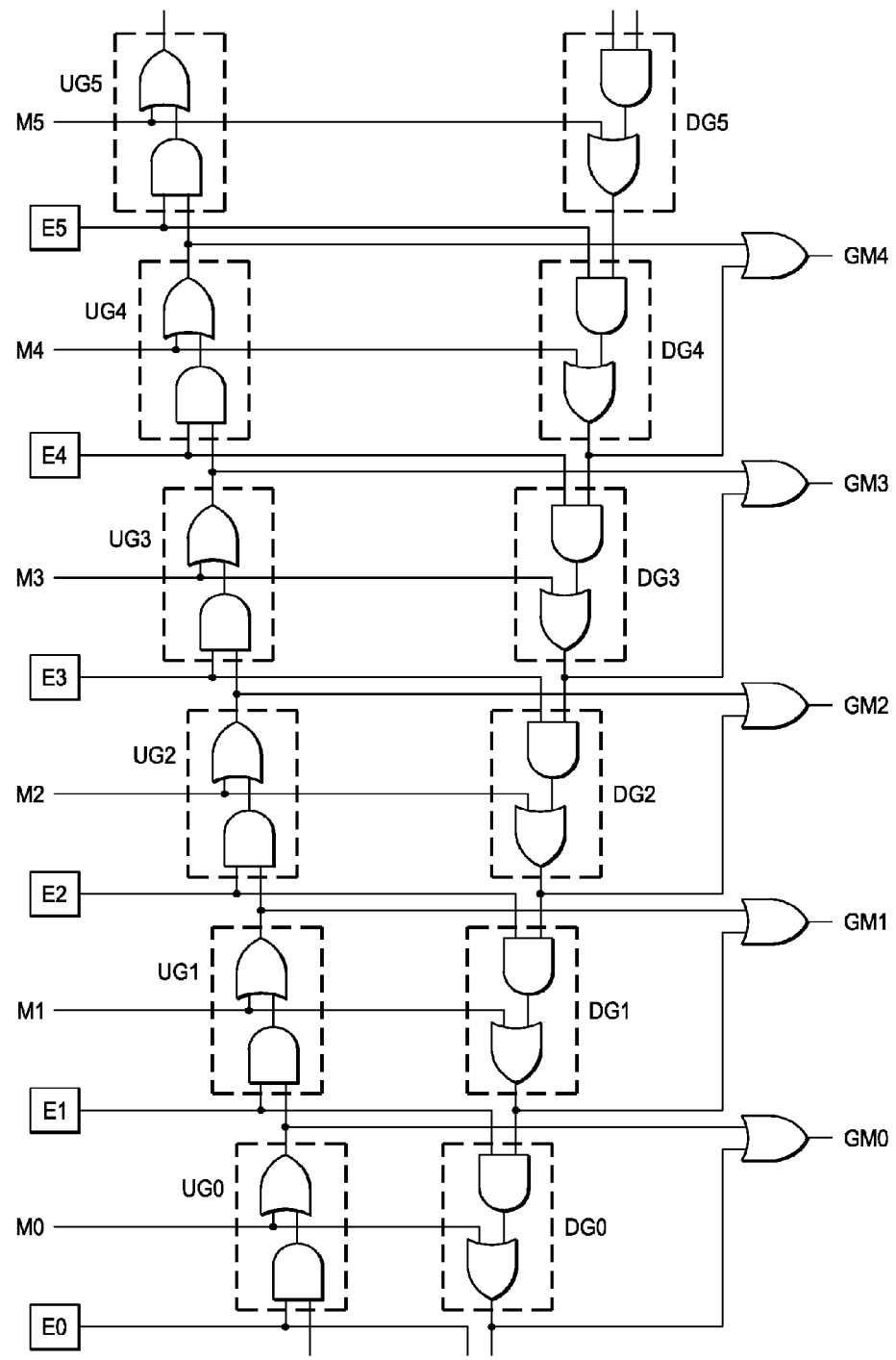
FIG. 4 is a schematic of a circuit that performs an AND function on the outputs of a first TCAM before chaining of multiple ranges according to an embodiment of the invention.

A circuit which accomplishes that function for illustrative purposes is shown in FIG. 4 for a subset of TCAM match outputs. The circuit accomplishes two functions. First, the boundaries between different groups of match lines are determined and second, all match lines within each group are or'ed together. So if any match line within a group is high all match outputs in the group are high.

A group of configuration register bits, shown in FIG. 4 as E0 through E5, are provided. FIG. 4 also shows match line outputs M0 through M5. These are meant as an illustrative subset of the match and enable signals for a TCAM which would have for example 512 match and 512 enable signals for a 512 word TCAM. One configuration register bit is provided for each match output, E0 corresponds to M0, E1 corresponds to M1, etc. A 1 value on the register's output signifies that its bits match output is in the same group as the next lower index match output. For example, if E1 is true, M1 is in the same group as M0. There is a chain of upward gates UG1-UG5 and a chain of downward gates DG1-DG5. Each match output has an upward gate and a downward gate. For example, M1 has UG1 and DG1. Looking at UG1, its output is logical high value if M1 is a logical high value, or if E1 is logical high value and UG0 is high value. UG0 will be a logical high value if M0 is a logical high value, among other cases. UG1 represents the group output at M1 which is a logical high value if M1 is a logical high value, or if any match output below M1 is a logical high value, for as far as the match outputs' enables E are true. In other words, match outputs propagate upwards to additional match outputs as long as they are successively enabled by each match output's enable bit. A source match output propagates upwards to a destination match output if all enables from the enable above the source match output to the enable at the destination match output are true.

The chain of downward gates DG1-DG5 operates similarly. If E2 is a logical high value, then M2 is in the same group as M1, and the output of DG2 will be or'ed into the DG1 gate. In other words, match outputs propagate downwards to additional match outputs as long as they are successively enabled by the enable bit above each additional match output. A source match output propagates downwards to a destination match output if all enables from the source match output to the enable above the destination match output are true.

Finally, at each match bit, the output of the upwards gate and the output of the downwards gate are or'ed together to produce a group match output, GM0-GM4. For example, at M1, the output of UG1 and DG1 are or'ed together to produce GM1. If any match output in M1's group is a logical high value, then GM1 and all other group match outputs in M1's group will be a logical high value.

For operation with a TCAM, boundary conditions at the top and bottom word are easily set. EU would be set to 0, since there is no lower word to add to M0's group. At the top word, match and enable inputs from a higher word would be tied to 0 at the input to the topmost downward gate (equivalent to DG5 in FIG. 4).

In the above discussion, the function of an enable register bit E0-E5 associated with a particular match output is to indicate whether or not the next lower index match output is in the same group. Though it is associated with the particular match output, it could equally have been associated with and indexed like the next lower match output. In that case, its function would indicate whether or not its associated match output was in the same group as the next higher match output, instead of the next lower match output. This change and the resultant change to the circuits presented below, is easily accomplished by those skilled in the art, so will not be discussed further.

More generally, an enable bit could be considered as located between two match outputs, and indicating whether or not they are in the same group. Its index would be identical to that of one of the neighboring match outputs, and would indicate whether that match output is in the same group as its neighbor. For generality, the multiple enable register bits can be simply considered a vector of enable registers or a vector of enable register bits. These enable bits may be more specifically called grouping enable bits, or a vector of grouping enable register bits, but for most of the discussion, it is clear which signals are being referred to, so they will be more concisely referred to simply as enable inputs or enable bits.

The logic in the above discussion has the enable signal having a value of 1 to indicate that neighboring match outputs are in the same group, and 0 to indicate that they are not. Opposite coding is possible and the logic could be adjusted accordingly. For clarity, the value indicating that neighboring match signals are in the same group can be called a group enabling value.

Figure 5:
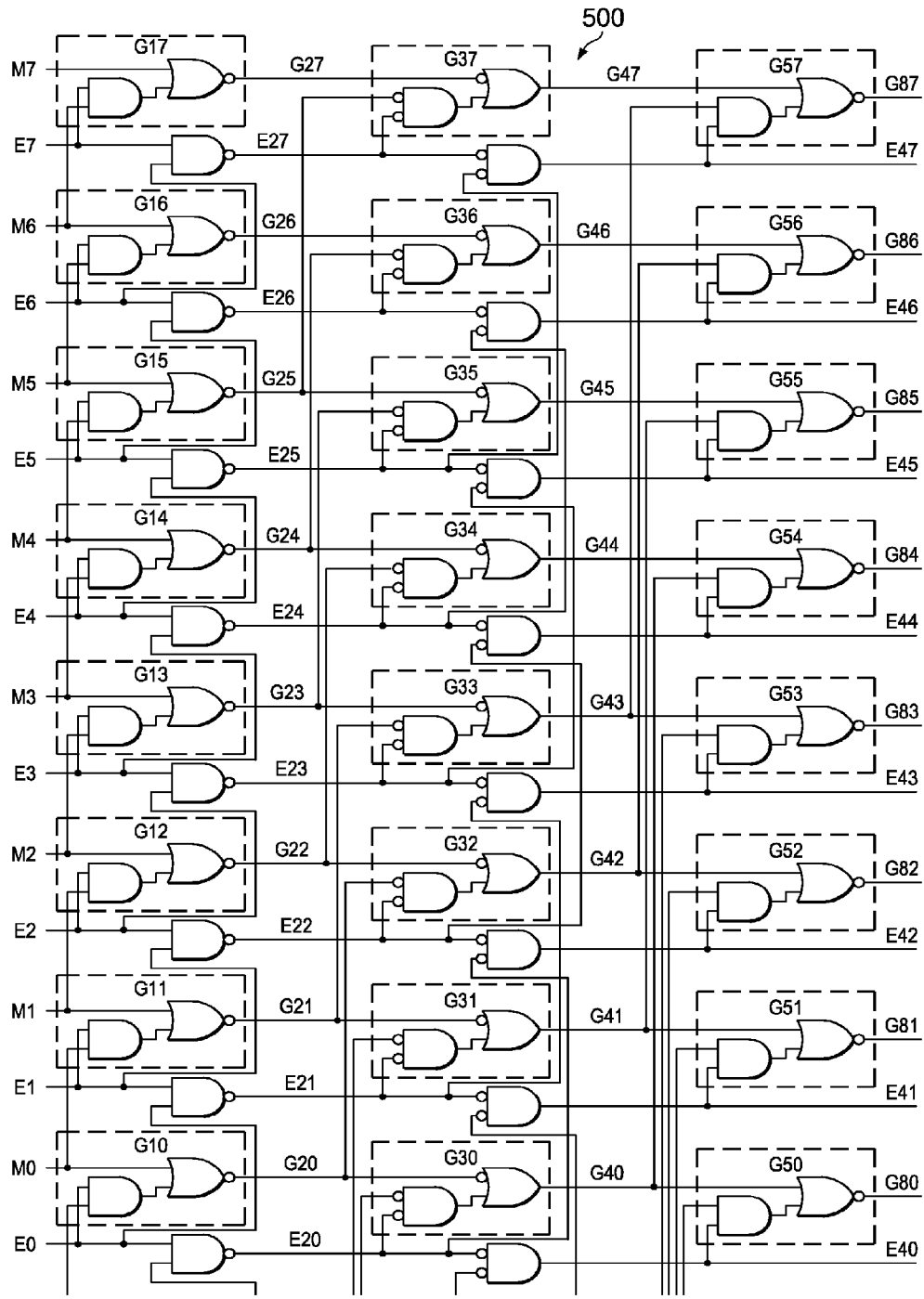
FIG. 5 is a schematic diagram of a circuit that functions as an upwards gate chain according to an embodiment of the invention.

FIG. 5 shows a circuit diagram of an embodiment of an upwards gate chain 500. In this embodiment, the upwards gate chain 500 has 8 match inputs M0-M7, 8 enable inputs E0-E7 and 8 group match outputs G80-G87, and allows a group size up to 8, though it will be seen that this structure generalizes to different sizes. A first level of gates G10-G17 will produce two-bit group match outputs G20-G27. A second level of gates G30-G37 will produce four-bit group match outputs G40-G47. A third level of gates G50-G57 will produce eight bit group match outputs G0-G8. Though three levels of gates are shown, each level doubles the size of the group which can be accommodated. Returning to the first level gates G10-G17, the output G24 for example is a logical low value if M4 is a logical high value or if E4 and M3 are logical high values.

Level 2 gates G30-G37 will have logical high outputs G40-G47, if their match inputs G20-G27 are a logical high value or if the match two bits lower are true and are in the same group. The second level gate G34, for example, will have a logical high output G44 if G24 input is a logical zero, or if G22 and E24 are logical high values. E24 is the logic NAND of E4 and E3.

At the third level, an 8 bit group match G0-G8 is produced by the logical functional OR of its 4 bit group match and the AND function of its 4 bit group enable and the 4 bit group match 4 bits lower. At each level, an N bit (where N is a power of 2) group match is produced for a bit B by the OR of bit B's N/2 bit group match and the AND of bit B's N/2 bit group enable and bit B-N/2's N/2 bit group match. Bit B's N/2 bit group enable is produced as the AND of bit B's N/4 bit group enable and bit B-N/4's N/4 bit group enable.

Note that while in the discussion, all signals are treated and labelled as positive logic signals, in FIG. 5 each gate is inverting, so signal polarities alternate per stage, minimizing the number of logic inversions to get to the output.

In FIG. 5, three levels of gate depth allow any output for a bit to collect match inputs from its bit and 7 lower bits, a total of 8 bits. The figure is drawn with 8 bits of input, but is easily generalized to a different or larger number of input bits. In the case of a 512 word TCAM, this upwards gate chain would have 512 match and 512 enable input bits. Each group match output at a bit would reflect the contributions of 8 match bits, that bit and the next 7 lower bits.

While FIG. 5 shows an implementation of an upwards gate chain, the implementation of a downwards gate chain is identical. If this input match and enable indices were reversed from 7:0 to 0:7, then the indices would be increasing moving down the left edge of the figure, and all the contributions to the group match output for a bit would be from that bit or bits higher in index. Note that both the upwards gate chain and the downwards gate chain have identical copies of two levels of group enable gates, such as E24 and E44. In practice a single copy of these gates would serve both upwards and downwards chain blocks.

Figure 6:
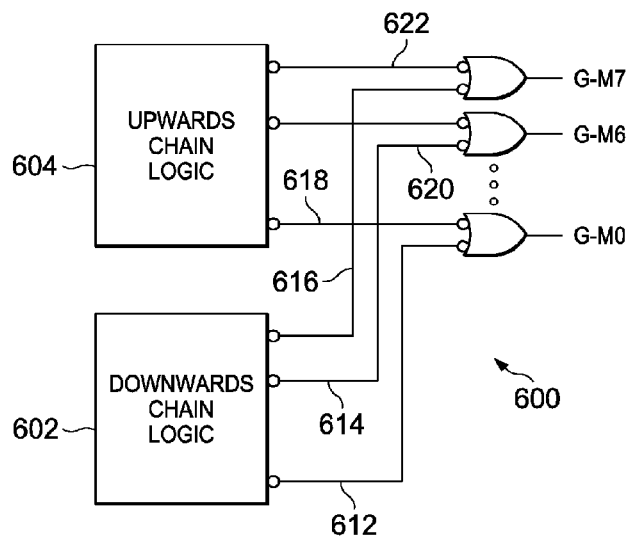
FIG. 6 is a schematic of a logic block including upwards chain logic, downwards chain logic and OR gates according to an embodiment of the invention.

The outputs of a downwards gate chain and an upwards gate chain are logically or'ed together as shown in FIG. 6 to produce a group match output GM0-GM7. This logic block 600 consisting of upwards chain logic 604, downwards chain logic 602 and OR gates 606-610 is referred to as a match-merge logic block. The outputs 618-622 of the upwards 604 and the outputs 612-616 downwards 602 chain logic blocks are indicated in negative logic as are the inputs to the OR gate. This optimization of signal polarities minimizes the number of logic inversions in the match-merge logic block function.

As drawn in FIG. 5 with three gate levels, a maximum group size of 8 is supported. If the 8 TCAM word members of a group are called W<7:0>, the GM7 output (shown in FIG. 6) would reflect the contributions by members W<6:0> through the upwards chain logic 604. W<7>'s contribution would appear through both the upwards 604 and downwards 602 chain blocks. The GM0 output (shown in FIG. 6) reflects the contributions by members W<7:1> through the downwards chain logic 602. W<0>'s contribution appears through both the upwards 604 and downwards 602 chain blocks. For an output in the middle, GM4 for example, the contributions of W<4:0> would be reflected through the upwards chain logic 604 and the contributions of W<7:4> would be reflected through the downwards chain logic 602.

If a fourth logic level were added to the upwards chain logic diagram of FIG. 5, and used in the match-merge logic block of FIG. 6, a maximum group size of 16 would be supported. A fifth logic level would allow a maximum group size of 32.

Figure 7:
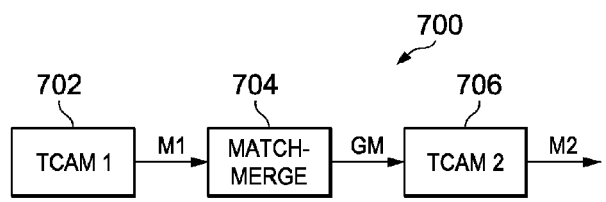
FIG. 7 is a block diagram illustrating an arrangement of two TCAMs suitable for an ACL table with one dimensional range processing according to an embodiment of the invention.

FIG. 7 shows an arrangement 700 of two TCAMs 702 and 706 suitable for an ACL table with one dimensional range processing. Consider for this case that one field FR uses ranges while the others, FN1, FN2, etc., do not. The field FR is presented to TCAM1 702, which is configured, for example, to operate in 4b DIRTCAM mode on all input bytes. Two copies of FR are presented to TCAM1 702, so that one copy can go to TCAM bytes configured to operate on the low 4b of each incoming byte, while the other copy can go to TCAM bytes configured to operate on the high 4b of each incoming byte. For example, if FR is a TCP source or destination port number, TCAM1 must be at least 32b wide. TCAM1 702 outputs match signals M1, one match signal for each TCAM word. These go to a match-merge block 704, which logically or's together match signals in each group as described earlier, producing group match signals GM with one signal per TCAM word. GM inputs to match chaining inputs of a second TCAM, TCAM2 706, with each GM signal enabling a match word of TCAM2 706. Finally, TCAM2 706 outputs its match signals M2.

As a programming example, consider this to be an ACL table with the standard TCP 5-tuple fields. One of the TCP source/destinations has a range, but the other 4 fields do not. For the single field with ranges, consider the earlier example of a 16b range:

| | FR field: W = 16 H = 9ace L = 3579 | | | | |
|---|---|---|---|---|---|
| output | 9 | a | c | 0-e | ;upper subspace |
| output | 9 | a | 0-b | — | ;upper subspace |
| output | 9 | 0-9 | — | — | ;upper subspace |
| output | 4-8 | — | — | — | ;middle subspace |
| output | 3 | 6-f | | | ;lower subspace |
| output | 3 | 5 | 8-f | — | ;lower subspace |
| output | 3 | 5 | 7 | 9-f | ;lower subspace |

Seven entries in TCAM1 702 would be programmed with the above ranges. The other fields would be in TCAM2 706. The other 4 fields would specify a single TCAM entry, either exact match or with wildcard bits for a ternary entry. Any one of the seven words used in TCAM1 702 for the FR field of this ACL entry can be used in TCAM2 706 for the single entry containing the other four fields. The combined programming for both TCAMs is below:

| TCAM1 | | | | TCAM2 | | | |
|---|---|---|---|---|---|---|---|
| 9 | a | c | 0-e | i | i | i | i |
| 9 | a | 0-b | — | i | i | i | i |
| 9 | 0-9 | — | — | i | i | i | i |
| 4-8 | — | — | — | i | i | i | i |
| 3 | 6-f | | | i | i | i | i |
| 3 | 5 | 8-f | — | i | i | i | i |
| 3 | 5 | 7 | 9-f | V | V | V | V | where for TCAM2 706, i indicates an invalid (not programmed) entry, and V indicates programmation with the field values.

The other 6 TCAM2 706 entries programmed as invalid are capable of holding alternative match entries. The constraint is that they would have to use the same range value programmed into TCAM1 702. However, it is often the case that the number of ACL entries is significantly larger than the number of distinct TCP port ranges or stated alternatively, any single TCP port range is likely to be reused multiple time with differing values for IP source, destination and port number. As a result, if multiple ACL entries can be found which share the same TCP port range, they can be programmed into the other 6 TCAM2 locations:

| TCAM1 | | | | TCAM2 | | | |
|---|---|---|---|---|---|---|---|
| 9 | a | c | 0-e | V7 | V7 | V7 | V7 |
| 9 | a | 0-b | — | V6 | V6 | V6 | V6 |
| 9 | 0-9 | — | — | V5 | V5 | V5 | V5 |
| 4-8 | — | — | — | V4 | V4 | V4 | V4 |
| 3 | 6-f | | | V3 | V3 | V3 | V3 |

-continued

| TCAM1 | | | | TCAM2 | | | |
|---|---|---|---|---|---|---|---|
| 3 | 5 | 8-f | — | V2 | V2 | V2 | V2 |
| 3 | 5 | 7 | 9-f | V1 | V1 | V1 | V1 |

Where the 7 TCAM2 706 locations are programmed with values V1 through V7, indicating 7 different entries in 7 words of TCAM2. This technique will be called range reuse.

Using this approach, the ACL rules using each distinct port range can be collected and placed together into the TCAM2 706 entries corresponding to the range. In this example, if there are more than 7 entries using a particular range, the group size can be expanded up to the maximum size designed into the match-merge block 704. For example, with 4 levels and a maximum group size of 16, up to 16 entries can be in a group. In the example above, all TCAM1 702 entries past the first 7 would be empty. A second option is to replicate the TCAM1 702 entries. For example, with 48 rules using the example range above, and a max group size of 16, the TCAM1 702 entries could be replicated 3 times, each in a group of 16 entries.

In actuality, sometimes ACL entries with a single range have that range on the TCP source port, while other entries have the range on the TCP destination port. In that case, both TCP source and destination port fields would be held in TCAM1 702. If 4b DIRTCAM coding were used with its 2× width expansion, TCAM1 702 would need to be at least 64 bits wide. When a TCP source port range expanded into multiple TCAM1 702 entries, the TCP destination port, a single entry, not a range, would be copied to all of the TCAM1 702 words used. Likewise, when a TCP destination port range expanded into multiple TCAM1 702 entries, the TCP source port, a single entry, not a range, would be copied to all of the TCAM1 702 words used. TCAM2 706 would hold IP source, destination and protocal. Putting multiple entries into the multiple available words resulting from a range expansion, like the V1 through V7 words above, would require that all entries shared identical values for both TCP source port and destination port.

Figure 8:
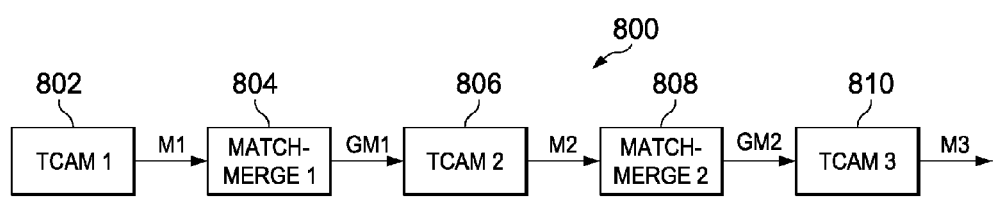
FIG. 8 is a block diagram illustrating an arrangement of three TCAMs suitable for an ACL table with two dimensional range processing according to an embodiment of the invention.

In order to accommodate two dimensions of ranges, the structure shown in FIG. 8 is used. FIG. 8 includes three TCAMs, 802, 806 810 and two match-merge blocks 804 and 808. The first range field would be input to TCAM1 802. If 4b DIRTCAM encoding is used, two copies of this field are sent to TCAM1 802, and the TCAM width is at least 2× that of the field. For example, if the field is 16b TCP source port, two copies of it are sent to TCAM1 802, which must be at least 32 bits wide. The match-merge1 block 804 logically or's all match outputs M1 into their proper groups, and provides a group match signal GM1 as a match chaining input to TCAM2 806. The second range field is input to TCAM2 806, which if using 4b DIRTCAM encoding, must be 2× the width of that field. For example, if the field is 16b TCP destination port, two copies of it are sent to TCAM2 806, which must be at least 32 bits wide. Its match outputs M2 input to the match-merge2 block 808, which logically or's these match outputs M2 into their proper groups, producing the GM2 group match outputs. GM2 provides the match chaining input to TCAM3 810, which operates as a conventional TCAM, accepting input for the other non-range fields. For example, these fields could be IP source and destination address and IP protocol, totaling 72 bits, requiring TCAM3 810 to be at least 72b wide.

In this structure 800, to represent an ACL entry with two dimensions of ranges, the number of TCAM entries used is the maximum of the number of entries required to represent each range. If the example above is used as the first dimension range, along with a different second dimension range, the TCAM expansion below results:

| Range1 field: W = 16 H = 9ace L = 3579 | | | | | | | | | | | |
|---|---|---|---|---|---|---|---|---|---|---|---|
| Range2 field: W = 16 H = 75cf L = 4320 | | | | | | | | | | | |
| TCAM1 | | | | TCAM2 | | | | TCAM3 | | | |
| i | i | i | i | i | i | i | i | V8 | V8 | V8 | V8 |
| 9 | a | c | 0-e | i | i | i | i | V7 | V7 | V7 | V7 |
| 9 | a | 0-b | — | i | i | i | i | V6 | V6 | V6 | V6 |
| 9 | 0-9 | — | — | 7 | 5 | 0-c | — | V5 | V5 | V5 | V5 |
| 4-8 | — | — | — | 7 | 0-4 | — | — | V4 | V4 | V4 | V4 |
| 3 | 6-f | — | — | 5-6 | — | — | — | V3 | V3 | V3 | V3 |
| 3 | 5 | 8-f | — | 4 | 4-f | — | — | V2 | V2 | V2 | V2 |
| 3 | 5 | 7 | 9-f | 4 | 3 | 2-f | — | V1 | V1 | V1 | V1 |

Here, the expansion of the second dimension range only requires 5 entries vs. the 7 for the first dimension, so the extra 2 entries in TCAM2 806 are invalid. Also, in this example, 8 entries are installed for the remaining fields, which all share the same value for the first and second range entries. The group is set to these 8 entries. For the 8th entry, both TCAM1 802 and TCAM2's 806 entries are invalid.

Note that in order to apply this range reuse, entries in the ACL table must be reordered to bring those with matching ranges together. Doing this correctly must include checking for overlaps of the involved rules' Boolean spaces. If the spaces do not overlap, reordering can be done freely, but in the presence of overlaps, the exact Boolean function represented by the ordered entries must be preserved.

If more dimensions of ranges than two are desired, the structure of FIG. 8 can be enhanced to provide additional TCAMs and match-merge blocks. For d dimensions, d+1 TCAMs are required and d match-merge blocks. No matter what the dimensionality, the maximum number of entries is limited to the maximum number for a single dimension, 2W/B−1, equal to 7 for 16b with a block size of 4. The structure described, with at least two match-merge blocks, enabling the representation of multiple dimensions of range with a code length no longer than the max for one dimension, is called a multi-range TCAM.

While the arrangement illustrated in FIG. 8 produces a compact and functionally correct implementation of multi-range capability, it has the disadvantage that the logic of all the match-merge units is arranged sequentially in time, potentially slowing down the maximum allowed clock frequency of operation, particularly if several match-merge units are chained together.

Figure 9:
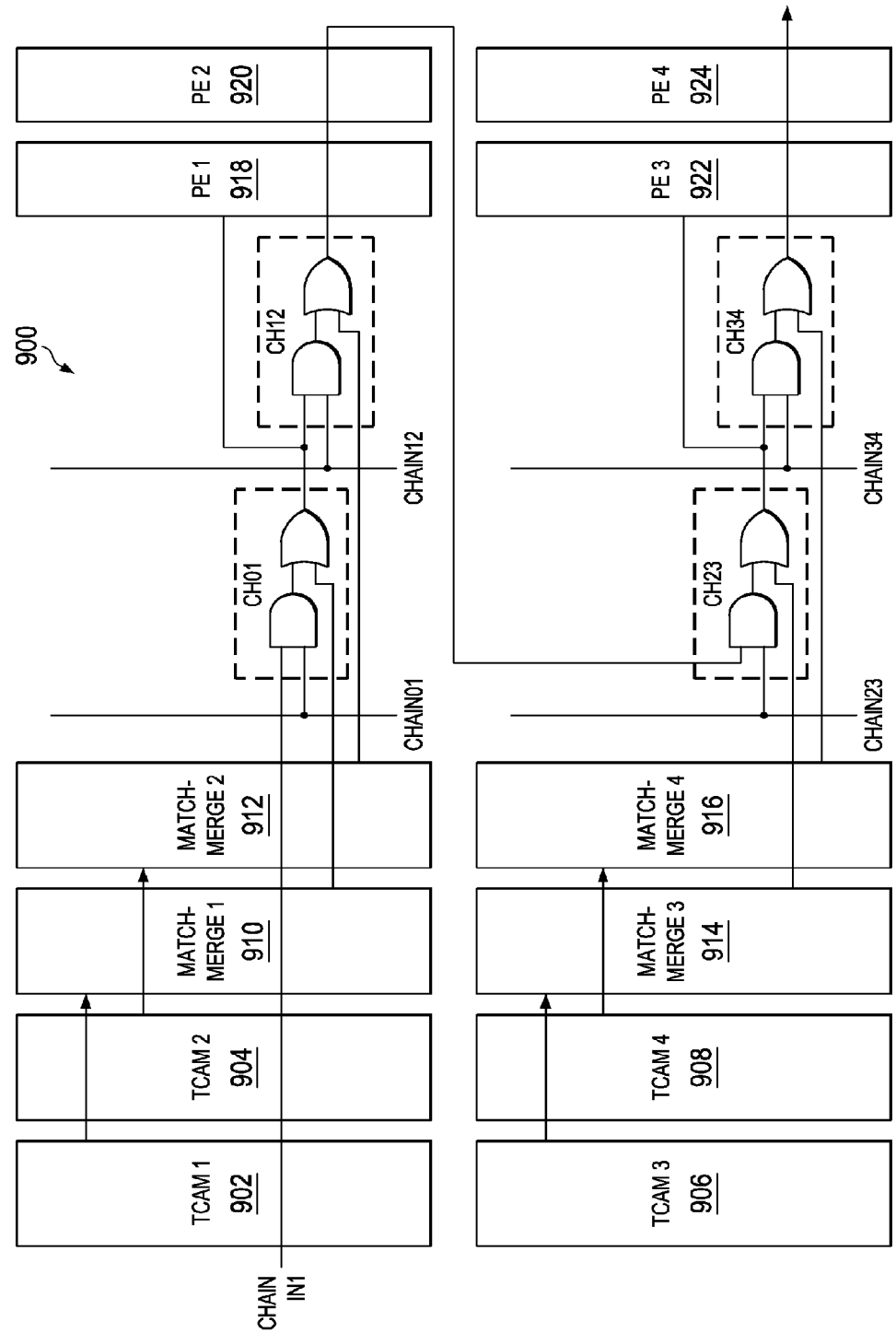
FIG. 9 is a block diagram illustrating an arrangement of four TCAMs suitable for an ACL table according to an embodiment of the invention.

FIG. 9 shows 4 TCAMs 902-908, each with match-merge logic 910-916 respectively, in an arrangement suitable for providing flexibility of ACL table configuration. Match-merge units are also grouped in pairs 910-912 and 914-916 and as a result, can share their enable bit registers and the group enable gate logic, such as gates E24 and E44 of FIG. 5. For example, if each TCAM 902-904 is 40 bits wide, each is wide enough to hold one 16 bit TCP source or destination port number, with 2× expansion for using 4 bit DIRTCAM mode. 8 bits are left over. The first two TCAMs 902-904 can be assigned to range fields, the TCP source and destination port numbers, while the second two TCAMs 906-908, chained together into 80 bit of total width are sufficient to hold the other 3 fields, IP source, destination and protocol, totaling 72 bits. In the 3rd and 4th TCAMs, TCAM3 906 and TCAM4 908, the match-merge blocks 914-916 would essentially be unused by setting all group enable bits to 0, so that every TCAM word is in a separate group.

FIG. 9 illustrates the logic to chain together the results of match-merge block 1 with the chain in1 input, an and-or chaining gate CH01, whose output is high if match-merge1's 910 output is high, or if chain in1 is high and the control signal chain01 is high. Chain01 is high to represent that the input chain in1 should be anded with the TCAM1's 902 match-merge output to form wider TCAM entries. Likewise, chaining logic gate CH12 is included to chain TCAM1 902 and TCAM2 904 together, enabled by the control signal chain12. CH12's output is high if match-merge2's 912 output is high, or if chain12 is high and CH01's output is high representing the output of TCAM1 902 and any TCAMs chained to its input. While these logic gates such as CH01 and CH02 are shown in the figure as one gate, the figure is meant to represent the logic on every word of the TCAMs, so for 512 word TCAMs for example, there would be 512 copies of each of these gates. The vertically drawn chain enable signals, chain01, chain12, chain23 and chain34 are broadcast to all gates, one per word. The horizontally drawn signals are meant to represent one signal per TCAM word.

Finally, priority encoders PE1, PE2, PE3 and PE4 are provided at the output of each vector of chaining logic gates, CH01 918, CH12 920, CH23 922 and CH34 924 respectively. These provide the normal function associated with TCAM operation where when provided all match lines as input (here the outputs of the chaining gates) the priority encoders output the address of the highest priority match.

The delay of the circuit 900 of FIG. 9 is one TCAM delay, plus one match-merge unit delay, plus one and-or chaining gate per stage, plus one priority encoder. Recognize that one skilled in the art can optimize the logic of the chaining gates for minimizing the number of inversions in the critical timing path, as well as for buffering to drive the distance across TCAMs to the next chaining gate.

A table is given below comparing code lengths for multiple prior approaches vs. multiple embodiments of the invention described earlier. For a DIRTCAM approach, results are listed for an internal coding style and for external coding, which affects only multi-dimension results. Finally, the multi-range embodiment will show improvement for multiple dimensions of range. With range reuse, either with a single match-merge block or multiple match-merge blocks for multiple range dimensions, it is possible to approach a cost of one TCAM entry per ACL entry.

|  | 1 range | d ranges | 16b d = 1 | 16b d = 2 |
|---|---|---|---|---|
| internal | 2W/B − 1 | (2W/B − 1)**d | | |
| external | 2W/B − 1 | d(2W/B − 1) + 1 | | |
| multirange | 2W/B − 1 | 2W/B − 1 | | |
| 4b internal | W/2 − 1 | (W/2 − 1)**d | 7 | 49 |
| 4b external | W/2 − 1 | d(W/2 − 1) + 1 | 7 | 15 |
| 4b multirange | W/2 − 1 | W/2 − 1 | 7 | 7 |
| 2b internal | W − 1 | (W − 1)**d | 15 | 225 |
| 2b external | W − 1 | d(W − 1) + 1 | 15 | 31 |
| 2b multirange | W − 1 | W − 1 | 15 | 15 |

W = width
B = DIRTCAM blocksize
d = dimensions

| Num Ranges | Previous Work Internal | Previous Work External | This Work (4 bit block) Internal | This Work (4 bit block) External | This Work (4 bit block) Multirange |
|---|---|---|---|---|---|
| 1 | 2W − 2 | W | W/2 − 1 | W/2 − 1 | W/2 − 1 |
| d | (2W − 2)d | 2d(W − 1) + 1 | (W/2 − 1)d | d(W/2 − 1) + 1 | W/2 − 1 |
| For W = 16: | | | | | |
| 1 | 30 | 16 | 7 | 7 | 7 |
| 2 | 900 | 61 | 49 | 15 | 7 |

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A Ternary Content Addressable Memory (TCAM) comprising:
input search data bits, the input search data bits separated into a plurality of groups wherein each group in the plurality of groups can be configured as range search bits or as search bits;
a plurality of TCAM words;
wherein each TCAM word of the plurality of TCAM words is operable to store a match pattern;
wherein each TCAM word of the plurality of TCAM words provides a match output;
wherein the match output indicates a match when the match pattern of the TCAM word matches the TCAM input search data bits;
wherein for each group in the plurality of groups, each group has a bit width N wherein N is a number of range search bits;
wherein for the match pattern for each group in the plurality of groups when the group is range search bits there is a Boolean function, the Boolean function using N range search bits;
wherein $(2^N)/2$ TCAM bits are provided for each TCAM word in the plurality of TCAM words;
where $2^N$ internal TCAM search lines associated are operable to search the $(2^N)/2$ TCAM bits;
wherein decoder logic associated with each group decodes the N range search bits;

wherein the decoder logic associated with each group drives the $2^N$ internal TCAM search lines;

wherein each of the TCAM bits identifies two TCAM memory bit-cells;

wherein each TCAM memory bit-cell of the $2^N$ TCAM memory bit-cells is associated with an associated input value of the N range search bits;

wherein each of the $2^N$ TCAM memory bit-cells is programmed with a match enabling value when the Boolean function indicates a match; and wherein each of said $2^N$ TCAM memory bit-cells is programmed with a match disabling value when said Boolean function indicates a mismatch.

2. The TCAM of claim 1 wherein N=4.

3. The TCAM of claim 1 wherein N=2.

4. The TCAM of claim 1 further comprising:

an input search data byte on each byte of a TCAM width;

wherein each byte of the TCAM width is independently configurable to operate in a first configuration where N=4;

wherein the TCAM range search bits are selected from the first configuration;

wherein each byte of the TCAM width operates in a second configuration with N=4; and wherein the TCAM range search bits are selected from the second configuration.

5. The TCAM of claim 4 further comprising:

a third configuration with N=2; and a fourth configuration wherein the TCAM input search data bits are provided from the input search byte data.

6. The TCAM structure of claim 4 further comprising:

a third configuration within N=2, the third configuration operating when the first configuration and the second configuration are not operating;

wherein each two bits of each byte of the TCAM width is independently configurable; and a fourth configuration, the fourth configuration operating when the first configuration and the second configuration are not operating;

wherein the two bits of the TCAM input search data bits are selected from the two bits of the input search byte data.

* * * * *